(12) United States Patent
Porte et al.

(10) Patent No.: US 12,013,302 B2
(45) Date of Patent: Jun. 18, 2024

(54) MULTIPOINT CONTACT DETECTION DEVICE AND METHOD

(71) Applicant: COMMISSARIAT A L'ENERGIE ATOMIQUE ET AUX ENERGIES ALTERNATIVES, Paris (FR)

(72) Inventors: Florian Porte, Grenoble (FR); Raphaël Morvillier, Grenoble (FR); Christophe Prat, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 174 days.

(21) Appl. No.: 17/451,066

(22) Filed: Oct. 15, 2021

(65) Prior Publication Data

US 2022/0163417 A1 May 26, 2022

(30) Foreign Application Priority Data

Oct. 16, 2020 (FR) ..................................... 20 10654

(51) Int. Cl.
*G01L 5/22* (2006.01)
*B60K 35/00* (2024.01)
*B62D 6/00* (2006.01)

(52) U.S. Cl.
CPC .............. *G01L 5/221* (2013.01); *B60K 35/00* (2013.01); *B62D 6/001* (2013.01); *G01D 2205/26* (2021.05)

(58) Field of Classification Search
CPC ......... G01L 5/221; B60K 35/00; B62D 6/001; B62D 1/046; G01D 2205/26;

(Continued)

(56) References Cited

U.S. PATENT DOCUMENTS 5,969,616 A    10/1999   Tschoi
5,986,860 A * 11/1999   Scott ....................... G01R 31/52
                                                       361/45

(Continued)

FOREIGN PATENT DOCUMENTS

CN        209842557 U     12/2019
CN        115699581 A *   2/2023 ............. B62D 15/02

(Continued)

OTHER PUBLICATIONS

French Preliminary Search Report dated Jun. 24, 2021 in French Application 20 10654 filed on Oct. 16, 2021, 4 pages (with English Translation of Categories of Cited Documents).

(Continued)

*Primary Examiner* — Octavia Davis Hollington
(74) *Attorney, Agent, or Firm* — Oblon, McClelland, Maier & Neustadt, L.L.P.

(57) ABSTRACT

A multipoint contact detection device includes at least two capacitive or inductive sensitive structures associated with respective primary detection zones of a surface that a person is likely to contact. The sensitive structures are positioned with a separation that is small enough between them to define at least one intermediate detection zone that the person is likely to contact while exerting a capacitive or inductive disturbance on the adjacent sensitive structures. The device also includes a processing circuit configured to detect, for each sensitive structure, a disturbance induced by the person coming into proximity or into contact and locating the region or regions of the surface with which the person comes into contact relative to the primary detection zones and the one or more intermediate detection zones.

22 Claims, 6 Drawing Sheets

(58) Field of Classification Search
CPC ....... H03K 17/9622; H03K 2017/9613; H03K 2217/9651
See application file for complete search history.

(56) References Cited

U.S. PATENT DOCUMENTS

| | | | |
|---|---|---|---|
| 7,109,862 B2 | 9/2006 | Braeuchle et al. | |
| 7,649,278 B2 * | 1/2010 | Yoshida | B60Q 1/1484 307/9.1 |
| 8,099,215 B2 * | 1/2012 | Kuramori | B62D 1/06 701/41 |
| 8,983,732 B2 | 3/2015 | Lisseman et al. | |
| 9,248,851 B2 * | 2/2016 | Van'tZelfde | B62D 1/046 |
| 9,827,996 B2 * | 11/2017 | McMillen | B62D 1/046 |
| 9,937,948 B2 * | 4/2018 | Oh | B60Q 9/00 |
| 9,994,231 B2 * | 6/2018 | Di Censo | G01L 5/221 |
| 2012/0296528 A1 | 11/2012 | Wellhoefer et al. | |
| 2018/0354543 A1 | 12/2018 | Nishio et al. | |
| 2019/0226879 A1 | 7/2019 | Lakatos et al. | |
| 2020/0158540 A1 | 5/2020 | Kunieda et al. | |

FOREIGN PATENT DOCUMENTS

| | | | |
|---|---|---|---|
| DE | 102018113203 A1 * | 12/2018 | ............. B62D 1/046 |
| DK | 179908 B1 | 9/2019 | |
| EP | 1 292 485 B1 | 2/2004 | |
| EP | 1 537 002 | 6/2005 | |
| EP | 3219256 A1 * | 9/2017 | ............. A61B 5/165 |
| FR | 3023519 A1 * | 1/2016 | ............. B62D 1/046 |
| JP | 2016-190570 A | 11/2016 | |
| WO | WO 2004/022409 A2 | 3/2004 | |
| WO | WO 2020/109181 A1 | 6/2020 | |
| WO | WO 2020/193142 A1 | 10/2020 | |

OTHER PUBLICATIONS

Baronti et al. "Distributed Sensor for Steering Wheel Grip Force Measurement in Driver Fatigue Detection", EDAA, 2009, 5 pages.

* cited by examiner

MULTIPOINT CONTACT DETECTION DEVICE AND METHOD

TECHNICAL FIELD

The present invention relates to multipoint contact detection devices, in particular those that use capacitive or inductive sensors and that measure a frequency variation produced by the proximity, the contact and the pressure of the hands of a person on a surface, as well as methods for locating and estimating the contact pressure.

PRIOR ART

In the context of autonomous vehicles and improving motor vehicle safety, there is a desire among manufacturers to instrument the interior in order to capture a maximum of information on the condition of the driver.

The measurement of the pressure of the hands on the steering wheel, when it is combined with other physiological data, is a good indicator of the mental state of the driver, such as, for example, his or her state of fatigue or of stress and the resulting lowering of concentration.

A great number of devices that make it possible to detect contact of the hands with the steering wheel using sensors positioned thereon have thus been proposed.

The U.S. Pat. No. 5,969,616 describes a method for detecting the pressure of the hands of the driver on the steering wheel, using a compressible coating attached to the steering wheel and a measurement of the electrical resistivity.

The application EP1537002 describes a device for detecting the contact of the hands using piezoelectric elements.

The U.S. Pat. No. 8,983,732 discloses a motor vehicle safety system comprising a plurality of pressure sensors positioned on the steering wheel of the vehicle, which are intended to detect the presence of the hands of the driver on the steering wheel.

The application JP2016190570 describes a system for detecting hands by capacitive measurement.

The application WO2020109181 describes a device for detecting the presence of the hands, comprising capacitive detection electrodes positioned on the steering wheel, which are linked to a measurement circuit common to all the electrodes.

The application EP1292485 describes a system for detecting the position of the hands using a set of resistive, capacitive or inductive sensors, the sensors being shorter than the width of a finger in order to distinguish the fingers from the thumbs.

The U.S. Pat. No. 7,109,862 describes a device for detecting the presence of the hands on the steering wheel using oscillators. This system measures neither the position of the hands on the steering wheel nor the pressure exerted thereby on the steering wheel.

The applications US20190226879 and DK179908 describe devices comprising a resonant circuit of LC type to detect the contact and the contact pressure of a person in a seat or of his or her hands on a steering wheel.

The application CN209842557 describes a device for recognizing a hand gesture using a resonant circuit and comprising several electrodes forming a U-shaped structure into which a moving hand can be introduced, the gesture being determined by analysis of the induced disturbance.

The article "*Distributed Sensor for Steering Wheel Grip Force Measurement in Driver Fatigue Detection*" describes a capacitive system for detection of the position of the hands comprising eight sensors distributed over the steering wheel, each comprising an RC oscillator and a microcontroller measuring the frequency emitted by the oscillator. The use of a multitude of microcontrollers makes the incorporation of this device relatively complex.

All these existing devices do not make it possible to optimally address, at the same time, the issues of the locating and the measuring of the pressure of the hands on the steering wheel, in a way that is reliable, relatively simple to implement and that offers high accuracy.

EXPLANATION OF THE INVENTION

There is consequently a need to further refine multipoint contact detection devices, notably in order to have a powerful device that is relatively inexpensive and simple to incorporate.

SUMMARY OF THE INVENTION

The invention aims to address this need, according to a first of its aspects, using a multipoint contact detection device, comprising:
  at least two capacitive or inductive sensitive structures, associated with respective primary detection zones of a surface that a person is likely to contact, at least two of these adjacent sensitive structures being positioned with a separation that is small enough between them to define at least one intermediate detection zone that the person is likely to contact while exerting a capacitive or inductive disturbance on the adjacent sensitive structure,
  a processing circuit configured to
    detect, for each sensitive structure, a disturbance induced by the person coming into contact or into proximity, the processing circuit being arranged to generate a signal representative of the amplitude of the disturbance induced by the contact or the proximity of the person with each primary detection zone, and
    locate, from the duly detected disturbances, the region or regions of the surface with which the person comes into contact, relative to the primary detection zones and the one or more intermediate detection zones, the contact being considered to be made in an intermediate detection zone when the disturbances induced on all or part of the primary detection zones satisfy predefined relationships, for example when the disturbances induced on each of the two primary detection zones adjacent to this intermediate detection zone exceed a predefined threshold.

By virtue of the invention, the number of detection zones is greater than the number of sensitive structures, because the contact may be located not only at the center of the primary detection zones but also between them in the intermediate detection zone or zones. It is thus possible to increase the spatial resolution of the measurement without however needing as many sensitive structures as positions that can be determined by detection. For example, by virtue of the invention, it is possible to have 2*N detection zones on the surface, therefore as many determinable positions, by using only N sensitive structures, by virtue of the fact that it is possibly to not only detect the contact in the primary detection zones, but also determine whether the contact takes place close to the center thereof or in an intermediate detection zone.

For a set number of detection zones, it is then possible to reduce the number of sensitive structures, which facilitates the incorporation of the device.

Preferably, the processing circuit is configured to measure the contact pressure of the person with the surface. In particular, the processing circuit can be arranged to generate a signal representative of the amplitude of the disturbance induced by the contact pressure of the person with the surface.

Preferably, the processing circuit is arranged to detect the disturbance induced on the oscillation frequency of an oscillator with resonant circuit of LC type, of which at least a part of the capacitance or of the inductance is formed by the sensitive structure. The LC circuits according to the invention can work at resonant frequencies for example lying between 10 kHz and 100 MHz.

Preferably, the processing circuit is arranged to generate a signal representative of the amplitude of the frequency variation induced by the contact pressure or the proximity of the person with each primary detection zone.

The stronger the pressure applied by the hands, the greater the contact surface, which makes it possible to indirectly measure the contact pressure.

The processing circuit can notably be arranged to compare the signal representative of the amplitude of the disturbance induced on at least one sensitive structure with at least one predefined threshold, or, better, at least two predefined thresholds, and to generate from this comparison at least one piece of information relating to the contact pressure of the person on the associated primary detection zone.

The processing circuit can be arranged to compare the signal representative of the amplitude of the disturbance induced on at least one sensitive structure with at least one predefined threshold, or, better, at least two predefined thresholds, and to generate from this comparison at least one piece of information relating to the location of the contact of the person on the associated primary detection zone, notably to determine whether the contact is centered or not on this primary detection zone.

In particular, the position of a hand at the center of a primary detection zone can be detected by the exceeding of a predefined threshold Sc, and the presence of a hand on an intermediate detection zone can be detected by the exceeding, on each of two sensitive structures corresponding to two primary detection zones adjacent to this intermediate detection zone, of a threshold Sprox lower than the first.

Preferably, the sensitive structures are capacitive. That can facilitate the production of the device and its incorporation on a steering wheel for example, because the sensitive structures can then easily be produced with simple metal armatures as electrodes.

Preferably, each sensitive structure comprises two electrodes, including at least one electrode specific to each sensitive structure, and, better, each sensitive structure comprises two specific electrodes, which can make it possible to reduce the interferences between sensitive structures.

When the device is installed in a vehicle in particular, it may be advantageous to eliminate the detection artifacts potentially linked to the accelerations undergone by the vehicle in its driving, which can exert an influence on the contact pressure of the hands of the driver on the steering wheel, for example.

Preferably, the device comprises at least one accelerometer, the processing circuit being arranged to take account of the disturbance induced by the acceleration on the measurement performed by means of the sensitive structures, it being, for example, arranged to disregard the result of the measurement performed by means of the sensitive structures when the detected acceleration, notably its modulus, is greater than a predefined threshold. The accelerometer can also be useful for delivering a piece of information relating to the orientation of the steering wheel, and this piece of information can be correlated to the position of the hands on the steering wheel as detected, to generate a piece of information relating, for example, to the quality of the driving.

In exemplary implementations of the invention, the device comprises at least three sensitive structures, or, better, at least four sensitive structures, defining at least five, even better at least eight, detection zones along the surface, notably four primary detection zones and, between them, four intermediate detection zones. The sensitive structures can be distributed on a maneuvering member, notably a steering wheel, and the processing circuit can be arranged to deliver a piece of information representative of the position of the hands on the maneuvering member, even the pressure of the hands on the maneuvering member.

Another subject of the invention, according to another of its aspects, is a maneuvering member, notably a steering wheel, equipped with a detection device according to the invention, as defined above.

The maneuvering member can comprise at least two electrodes associated with one and the same primary detection zone on the maneuvering member, these electrodes preferably being diametrically opposite when the maneuvering member is observed in section.

The invention relates also, according to another of its aspects, to a method for locating on a surface at least one point of contact of a person with that surface, using a multipoint contact detection device comprising at least two capacitive or inductive sensitive structures, associated with respective primary detection zones of the surface, at least two of these adjacent sensitive structures being positioned with a separation that is small enough between them to define at least one intermediate detection zone that the person is likely to contact while exerting a capacitive or inductive disturbance on the adjacent sensitive structures, notably a device according to the invention as defined above, a method in which:

for each sensitive structure, a disturbance induced by the person coming into contact or into proximity is detected, and from the duly detected disturbances, the region or regions of the surface with which the person comes into contact, relative to the primary detection zones and the one or more intermediate detection zones, are located, the contact being considered to be made in an intermediate detection zone when the disturbances induced on all or part of the primary detection zones satisfy predefined relationships, for example the contact being considered to be made in an intermediate detection zone when the disturbances induced on each of the two primary detection zones adjacent to this intermediate detection zone exceed a predefined threshold.

In exemplary implementations of the invention, during a calibration step for each user and for each primary detection zone, a threshold Sc of amplitude of disturbance induced on the corresponding sensitive structure, representative of the contact without pressure of the person with this primary detection zone, is determined. It is notably possible to determine, during a calibration step for each user and for each primary detection zone, a threshold Spmax of amplitude of disturbance induced on the sensitive structure, representative of a maximum pressure exerted by the person on this detection zone.

Since the sensitivity to pressure is not linear (because it is greater for low pressures), it can be corrected by a polynomial interpolation to determine a sensitivity curve. The coefficients and the order of the sensitivity curve will for example be able to be measured in the factory on a calibration bench by the application of a known force. This calibration will then be able to be adapted to determine the offset and the multiplying coefficient that are specific to each driver when measuring the thresholds Sprox. Sc and Spmax. The range Sc-Spmax can be segmented so as to distinguish M pressure levels.

It is also possible to determine, during a calibration step, for each user and for each primary detection zone, a threshold Sprox of amplitude of disturbance induced on the sensitive structure, corresponding to the person, notably his or her hand, coming into proximity with the primary detection zone, without contact thereof with this primary detection zone.

In exemplary implementations of the invention, Sprox designating a threshold amplitude of disturbance induced on the sensitive structure corresponding to a hand of the person coming into proximity with the primary detection zone, without contact thereof with this primary detection zone, Sc designating a threshold of amplitude of disturbance induced on the corresponding sensitive structure, representative of the contact without pressure of the hand of the person with this primary detection zone, Spmax designating the threshold of amplitude of disturbance induced on the sensitive structure, representative of a maximum pressure that can be exerted by the hand of the person on this detection zone, the position of the hands of the person with the surface is determined, by repeating the following steps, for j an integer lying between 1 and the number N of primary detection zones, Sj designating the amplitude of disturbance induced on the sensitive structure corresponding to the primary detection zone j:

if Sprox<Sj<Sc and Sprox<Sj+1<Sc, then it is determined that the hand is located on the intermediate detection zone between the primary detection zones j and j+1, if Sc<Sj<Spmax, then it is determined that the hand is located on the primary detection zone j, if Sj>Spmax and Sk<Sprox, for k< >j, k lying between 1 and N, then it is determined that both hands are positioned in the primary detection zone j, if Sj>Spmax on the one hand, and Sj+1>Sprox or Sj−1>Sprox on the other hand, then it is determined that one hand is on the primary detection zone j and the other hand is on the primary detection zone j+1 or on the adjacent primary detection zone j−1.

A normal attitude of the person corresponding to his or her hands coming into contact with two respective primary detection zones u and v, it is possible to determine, in an exemplary implementation of the method, whether the measured amplitudes Su or Sv of disturbance induced on the sensitive structure satisfy the relationships Su>Sc and Sv>Sc, in which Sc designates a threshold of disturbance induced on the sensitive structure by the contact without pressure of the hand of the person on the corresponding primary detection zone.

The contact pressure of each hand of the person with the surface can then be assessed by quantifying the amplitudes Su and Sv according to the pressure levels previously established over the interval Sc-Spmax.

Advantageously, an acceleration to which the surface is subjected is measured, and if the modulus of the acceleration exceeds a predefined threshold the measurement of the disturbance induced on the sensitive structures is disregarded. The use of an accelerometer thus makes it possible to exclude the artifacts linked to the irregularities of the road and to the turns.

The method according to the invention can be applied to the determination of the position of the hands of a driver on a steering wheel, in which an alarm is generated when the duly determined position of the hands does not correspond to an expected driving position. For example, if the position of the hands is estimated to be unsuitable for a predefined time, for example 10 s, a message is addressed to the user.

Another subject of the invention, independently or in combination with the above, is a multipoint contact detection device, comprising:
  at least two capacitive or inductive sensitive structures, associated with respective detection zones of a surface that a person is likely to contact,
  a processing circuit configured to
    detect, for each sensitive structure, a disturbance induced by the person coming into contact or into proximity, the processing circuit being arranged to generate a signal representative of the amplitude of the disturbance induced by the contact or the proximity of the person with each sensitive structure,
    receive at least one value representative of an acceleration undergone by the device, the latter being able to comprise, or not comprise, an accelerometer,
    locate, from the duly detected disturbances, the region or regions of the surface with which the person comes into contact, and, if appropriate, the contact pressure, the value of the acceleration received being taken into account in the determination of the location and/or contact pressure.

In particular, the processing circuit can be arranged to disregard the result of the measurements of the disturbance induced when the modulus of the acceleration exceeds a predefined value.

The device according to this other aspect of the invention can have all or part of the features mentioned above, linked with the device according to the first aspect of the invention.

BRIEF DESCRIPTION OF THE DRAWINGS

The invention will be able to be better understood on reading the following detailed description, of nonlimiting exemplary implementations thereof, and on studying the attached drawing, in which.

DETAILED DESCRIPTION

Figure 1:
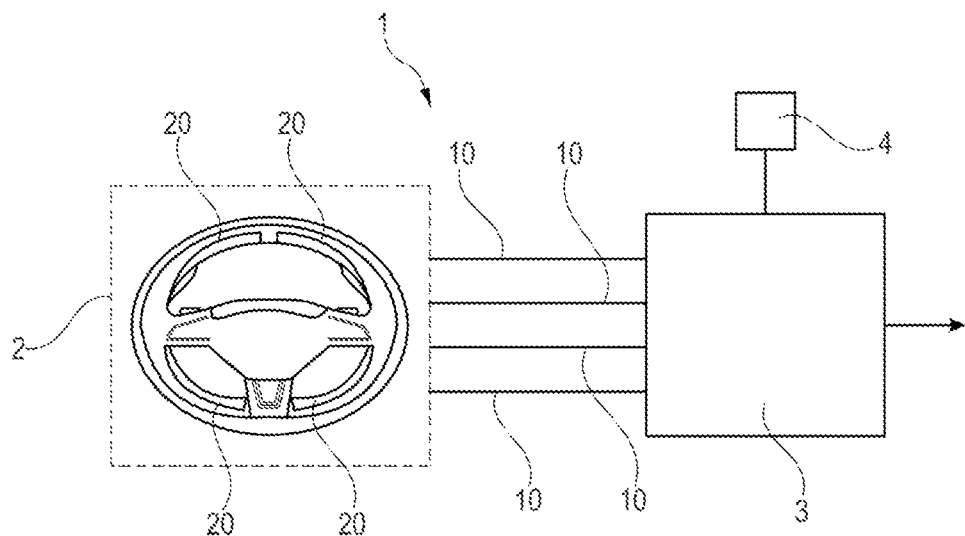
FIG. 1 schematically and partially represents an example of a detection device according to the invention that makes it possible to detect the position of the hands on a steering wheel.

FIG. 1 illustrates an example of a detection device 1 according to the invention, with which a steering wheel 2 is equipped. This device 1 comprises N sensitive structures 20, four of them in the example considered, respectively named "sensor 1", "sensor 2", "sensor 3" and "sensor 4" in FIG. 5, making it possible to define 4 respective primary detection zones, referenced D2, D4, D6 and D8 and four intermediate detection zones referenced D1, D3, D5 and D7 in this figure. The primary detection zones D2, D4, D6 and D8 coincide with the sensitive structures 20. The latter are separated from one another, and the intermediate detection zones coincide with the spaces situated between the sensitive structures 20. Each primary detection zone extends over, for example, a little less than a quarter of the steering wheel 2. Each intermediate detection zone is of smaller angular extent, and a hand positioned on an intermediate detection zone will be in contact or in proximity with the adjacent primary detection zones.

Each sensitive structure 20 is linked by a wired link 10 to a processing circuit 3 configured to detect the disturbances induced by the presence of the hands on the steering wheel, in order to locate the contact.

The device 1 can comprise at least one accelerometer 4 that is linked to the processing circuit 3 and makes it possible to take account of the disturbance induced by the acceleration on the measurement performed by means of the sensitive structures 20, as will be detailed later.

The detection can implement at least one oscillator with resonant circuit of LC type of which the sensitive structure 20 forms all or part of the capacitance or of the inductance, the hands coming into contact or into proximity with the sensitive structure 20 inducing a variation of the capacitance or of the inductance of the LC resonant circuit.

Figures 2A, 2B:
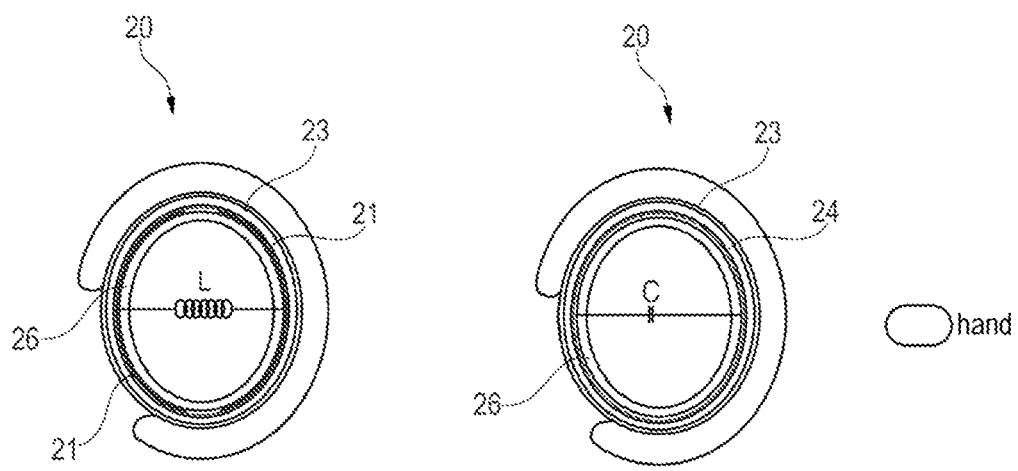
FIG. 2 represents two schematic and partial cross sections of the steering wheel schematically illustrating two sensitive structure arrangements according to the invention, namely capacitive (FIG. 2A) or inductive (FIG. 2B), FIG. 3 partially and schematically represents certain details of implementation of an example of a processing circuit according to the invention.

Each sensitive structure 20 is preferably capacitive and comprises two metal armatures 21 diametrically opposed on the rim 26 of the steering wheel, as illustrated in FIG. 2A. In this figure, the inductance L of the resonant circuit, associated with the capacitance formed by the armatures 21, has been represented schematically. This inductance may or may not be incorporated in the steering wheel and of set value.

The armatures 21 can be covered, as illustrated, by a coating of an electrical insulator 23, preferably a compressible flexible material, for example an elastomer. The presence of such a material makes it possible to more accurately measure the contact pressure, because this material deforms when the driver presses on it, causing a variation of the distance from the hand to the armatures 21 of the sensitive structure. Each armature is, for example, of rectangular form, with a width of between 5 and 30 mm.

In the variant illustrated in FIG. 2B, each sensitive structure 20 is inductive and comprises, for example, a coil 24 wound on the rim 26 of the steering wheel, which forms all or part of the inductance L of the LC resonant circuit. In this figure, the associated capacitance C, which need not be incorporated in the steering wheel, and of set value, is illustrated schematically.

The positioning of the armatures 21 according to FIG. 2A, namely opposite one another, notably on either side of a median cylindrical surface coaxial to the axis of rotation of the steering wheel, makes it possible to be particularly sensitive to the pressure of the hands.

Figure 3:
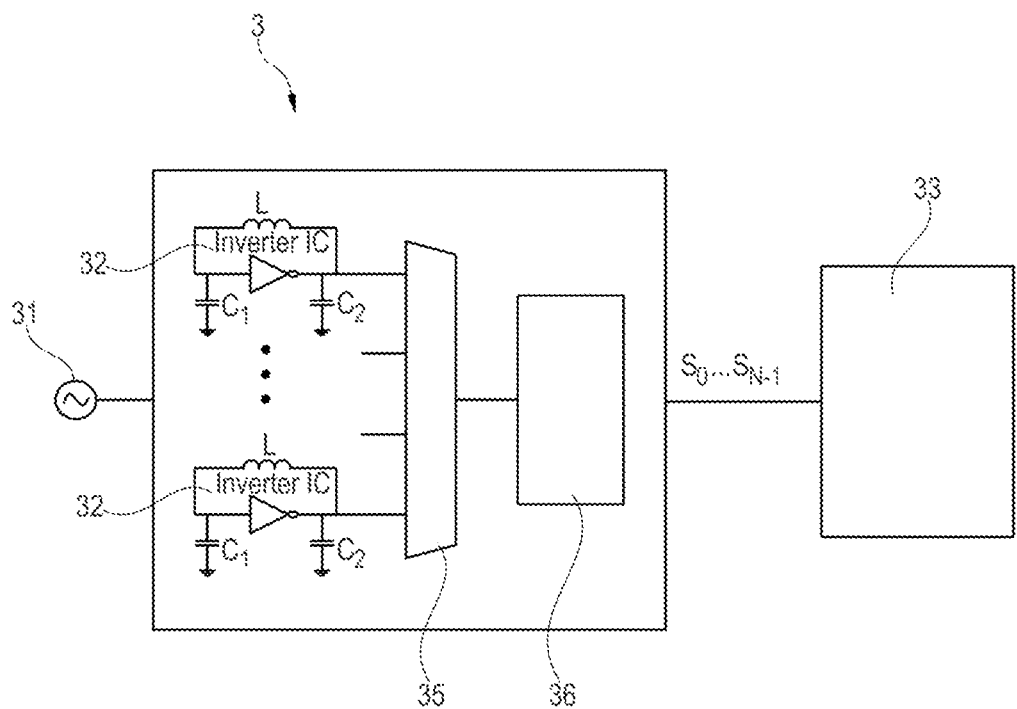

The processing circuit 3 can comprise one or more resonant circuits 32, for example of Colpitts type with an LC circuit comprising, as illustrated in FIG. 3, an inductance L and two capacitances $C_1$ and $C_2$. The resonant circuit 32 can comprise, as illustrated, an inverter, for example an inverter of type 7404. In other examples, it comprises a transistor (for example bipolar, JFET or MOSFET) and/or any other amplifier.

In the example illustrated, a multiplexer 35 allows N LC oscillators 32 to be sequentially powered and a processor 36 determines and digitizes the resonant frequency of the resonant circuits 32 by counting the number of oscillations over a defined time (by using for example the "timer" input of the processor). The circuit can receive a clock signal 31, for example 40 MHz. The N output signals ($S_0$ to $S_{N-1}$) can be processed by a processor 33 according, for example, to the method described in FIG. 7, or transmitted to another control member which will perform the processing.

In the example considered, the proximity and the pressure of the hands on the steering wheel cause the resonant frequency of the LC circuit associated with the duly stressed sensitive structure 20 to vary. The processing circuit 3 is arranged to generate a signal representative of the amplitude of the frequency variation induced by the contact of the person, as illustrated in FIG. 4.

In this example, the driver positions one hand on a corresponding sensitive structure 20 and performs, in order, the following actions: repetition five times of the positioning of the hands in proximity to the sensitive structure (signal 41), observing a distance from the steering wheel of less than 1 cm, followed by a distancing of the hands, five repetitions with the hands in contact with the steering wheel without applying pressure (signal 42), and five repetitions with the hands gripping the steering wheel with a maximum pressure (signal 43).

Figure 4:
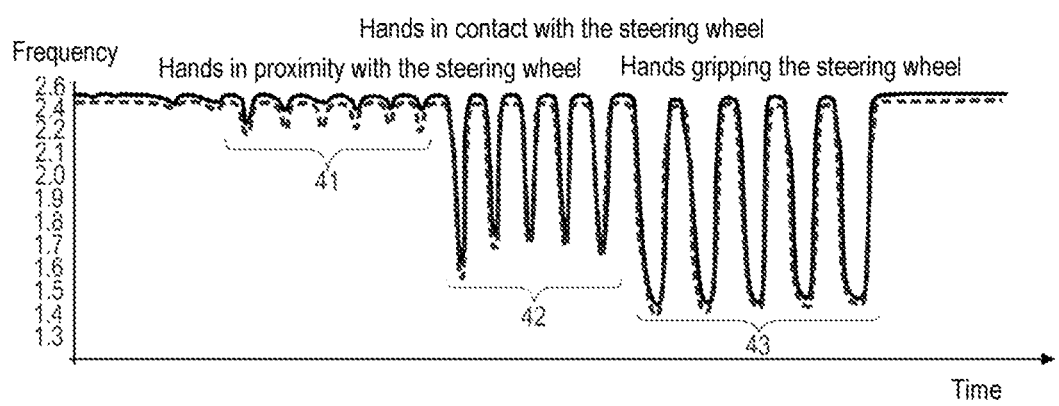
FIG. 4 is a graph illustrating the trend of the measurement as a function of time when the hands are successively placed in proximity to the steering wheel, in contact without pressure on the steering wheel or gripping the steering wheel.

In FIG. 4, each curve corresponds to the response of a sensitive structure undergoing the action of a hand of the driver. The graph shows that the frequency variation induced by the hand of the driver, with respect to the resonant frequency when the hand is distanced, is representative of the contact force. The three actions can thus be clearly differentiated and the of the two sensitive zones produce a similar response for both hands.

The use of several sensitive structures distributed over the circumference of the steering wheel makes it possible to locate the hands when the latter come into contact with the steering wheel.

In the example considered, each sensitive structure 20 occupies a little less than 90° on the steering wheel 2, about the axis of rotation thereof, and the separation between the sensitive structures 20 is small enough for the positioning of the hand between two adjacent sensitive structures to exert a detectable disturbance thereon.

Figure 5:
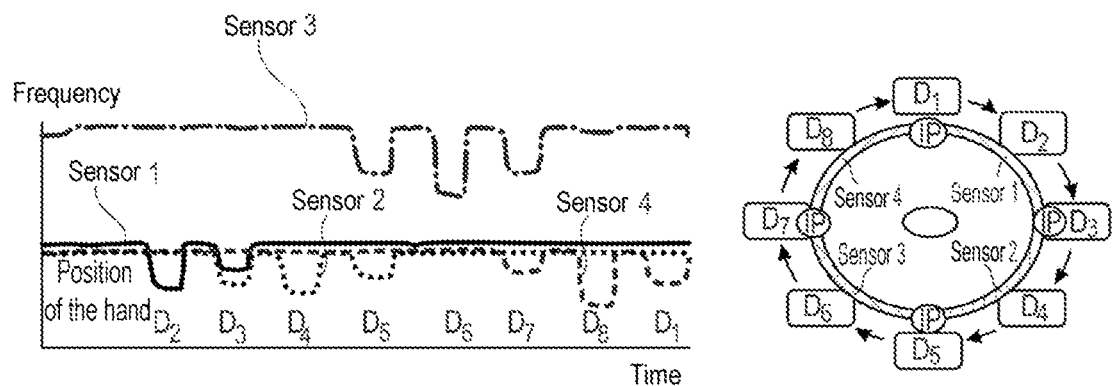
FIG. 5 is a graph representing the response measured upon the positioning of a hand on eight successive detection zones D1 to D8 distributed over the circumference of the steering wheel.

The graph of FIG. 5 represents the response of the 4 sensitive structures 20 as a function of the successive positioning of a hand on the eight primary detection zones D2, D4, D6 and D8 (at the center thereof) and intermediate detection zones D1, D3, D5 and D7.

The hand coming into contact with a primary detection zone at the center of the corresponding sensitive structure 20 can be detected by the exceeding of a frequency deviation threshold of the associated resonant circuit.

The positioning of the hand on an intermediate detection zone can be detected by the measurement of the frequency deviation of the resonant circuits associated with the two adjacent primary detection zones.

As an example, when the hand is placed on the intermediate detection zone D5, the curves representative of the disturbance induced on the sensitive structures 20 associated with the primary detection zones D4 and D6 (namely the sensitive structures "sensor 2" and "sensor 3") simultaneously undergo a frequency deviation. When the hand goes to position D6, a stronger induced disturbance is observed (the dip is more pronounced) for the sensor 3, whereas the sensor 2 is no longer disturbed.

Figure 6:
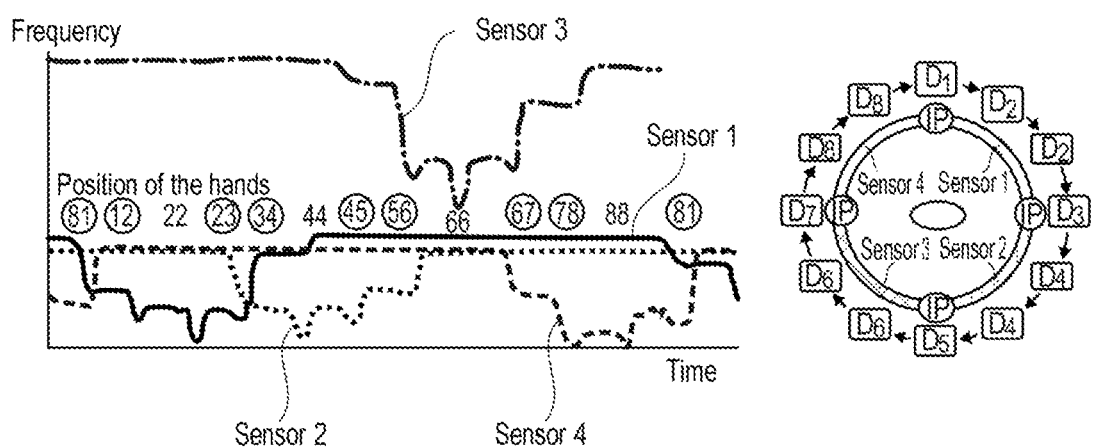
FIG. 6 is a graph similar to that of FIG. 5, representing the response of the upon the contact of both hands positioned side-by-side on the steering wheel, for several successive positions.

The graph of FIG. 6 represents the response of the 4 sensors as a function of the simultaneous contact of both hands on the steering wheel.

In this example, the hands are positioned side-by-side, on the same primary detection zone or on a primary detection zone and an adjacent intermediate detection zone respectively. The hands are displaced in succession in the clockwise direction starting from the position 81, that is to say one hand on the primary detection zone D8 defined by the sensor 4 and one hand on the intermediate detection zone D1 defined between the sensor 4 and the sensor 1.

The hands then successively take 12 distinct positions, being displaced alternately, that is to say that there is always one hand in contact with the steering wheel during this experiment. The frequency variations measured for each sensitive structure 20 reach their maximum when both hands are in contact with the primary detection zone associated with this sensitive structure, which corresponds to the positions 22, 44, 66 or 88.

Figure 7:
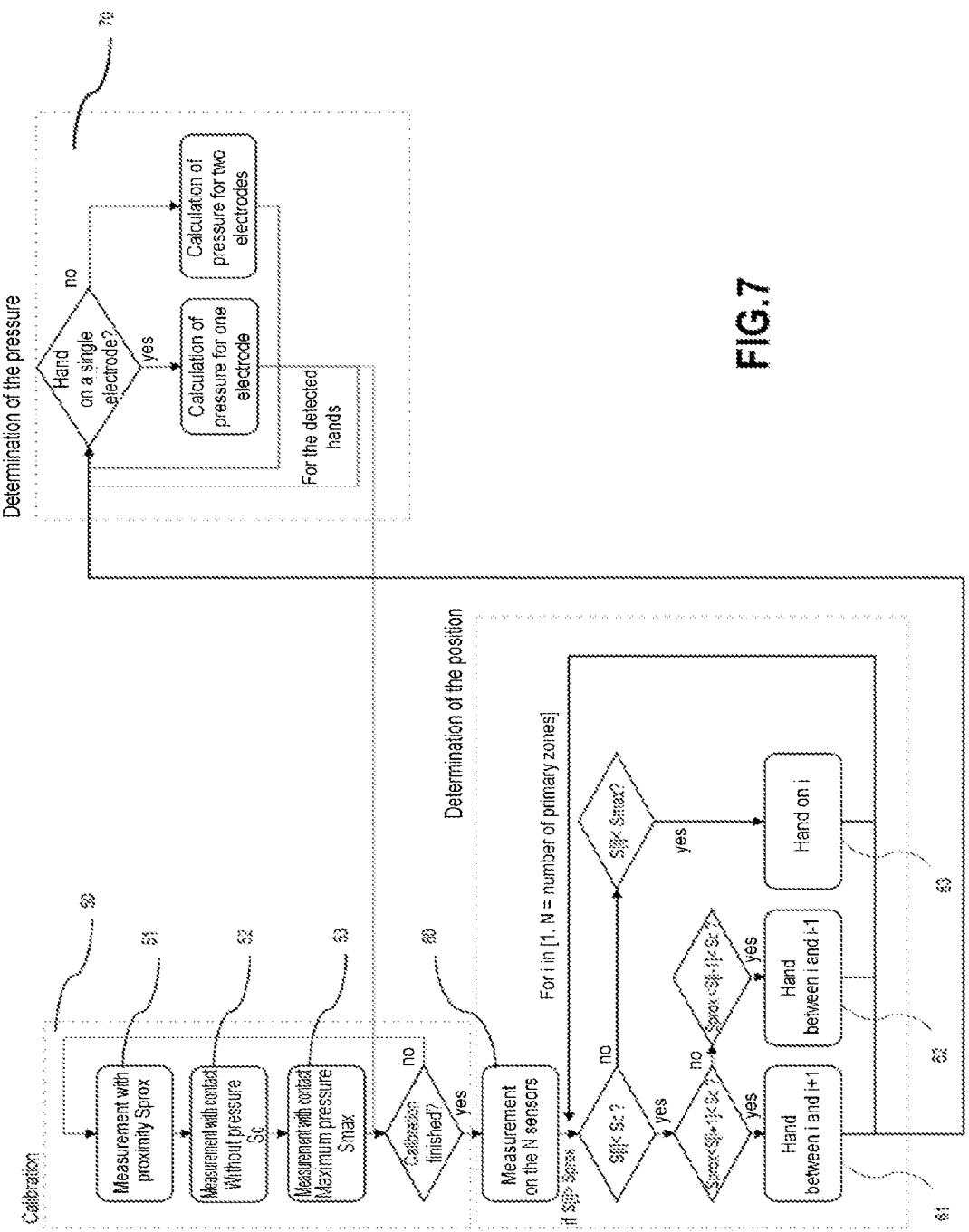
FIG. 7 is a block diagram illustrating steps of an example of a method for determining the position and contact pressure according to the invention.
Figure 8:
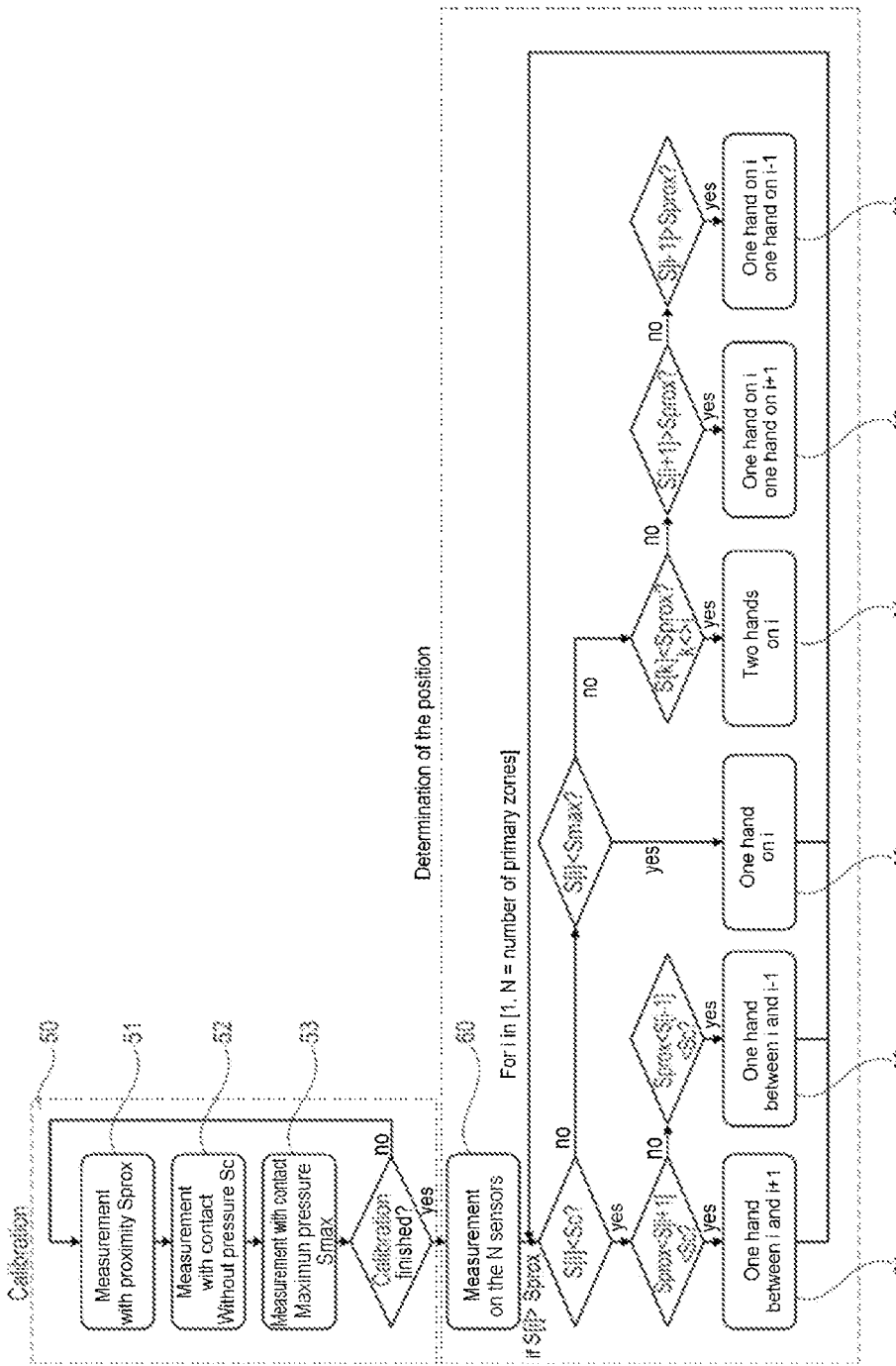
FIG. 8 is a view similar to FIG. 7 of a method variant.

To determine the point of contact of one or more hands on the steering wheel, algorithms as illustrated in FIGS. 7 and 8 can be implemented.

The algorithm of FIG. 7 aims to locate the contact of a single hand on the steering wheel. Hereinbelow, the disturbance amplitude is, for example, given by the amplitude of frequency deviation of the resonant circuit under the effect of the induced disturbance, with respect to the resonant frequency in the absence of disturbance.

First of all, during a calibration phase 50, for each primary detection zone, three thresholds of amplitude of disturbance induced on the corresponding sensitive structure are determined, namely:
 a threshold Sprox (step 51), corresponding to the hand coming into proximity with the primary detection zone, without contact thereof with this primary detection zone,
 a threshold Sc (step 52), representative of the contact of the hand with this primary detection zone without pressure,
 a threshold Spmax (step 53), representative of a maximum pressure exerted by the hand on this primary detection zone.

Once this calibration phase has been performed, the position of the hand on the steering wheel 2 can be determined by repeating the following steps:
 the amplitude of disturbance induced on the sensitive structure corresponding to each primary detection zone is measured (step 60),
 for j an integer lying between 1 and the number N of primary detection zones, Sj designating the amplitude of disturbance induced on the sensitive structure corresponding to the primary detection zone j, and for Sj>Sprox:
  if Sj<Sc and Sprox<Sj+1<Sc (step 61), then it is determined that the hand is located on the intermediate detection zone between the primary detection zones j and j+1.
  if Sj<Sc and Sprox<Sj−1<Sc (step 62), then it is determined that the hand is located on the intermediate detection zone between the primary detection zones j−1 and j,
  otherwise, i.e. Sc<Sj<Spmax, then it is determined that the hand is located on the primary detection zone j (step 63).

Once the contact is located, it is possible to estimate the contact pressure and/or the extent of the contact (step 70), the induced disturbance increasing with the contact pressure and/or the extent of the hand situated facing the sensitive structure.

The algorithm illustrated in FIG. 8 aims to determine the position of one or two hands on the steering wheel.

First of all, during a calibration phase 50 for each primary detection zone, three thresholds of amplitude of disturbance induced on the sensitive structure Sprox, Sc and Smax are determined, as described previously (see steps 51 to 53 above).

Once the calibration is finished, the position of the hands on the steering wheel can be determined by repeating the following steps:
 the amplitude of disturbance induced on the sensitive structure corresponding to each primary detection zone is measured (step 60),
 for j an integer lying between 1 and the number N of primary detection zones, Sj designating the amplitude of the disturbance induced on the sensitive structure corresponding to the primary detection zone j, and assuming Sj>Sprox:
  if Sj<Sc and Sprox<Sj+1<Sc, then it is determined that the hand is located on the intermediate detection zone between the primary detection zones j and j+1 (step 61)
  Sc<Sj<Spmax, then it is determined that the hand is located on the primary detection zone j (step 63),
  if Sj<Sc and Sprox<Sj−1<Sc, then it is determined that the hand is located on the intermediate detection zone between the primary detection zones j−1 and j (step 62),
  if Sj>Spmax and Sk<Sprox, for k< >j, k lying between 1 and N, then it is determined that both hands are positioned in the primary detection zone j (step 64),
  if Sj>Spmax on the one hand, and Sj+1>Sprox or Sj−1>Sprox on the other hand, then it is determined that one hand is on the primary detection zone j and the other hand is on the primary detection zone j+1 (step 65) or on the adjacent primary detection zone j−1 (step 66).

Preferably, an algorithm such as that illustrated in FIG. 7 is used when it is determined previously that a single hand, at most, will be in contact with the steering wheel, and an algorithm such as that illustrated in FIG. 8 will be used in the cases where up to two hands can contact the steering wheel.

Figure 9:
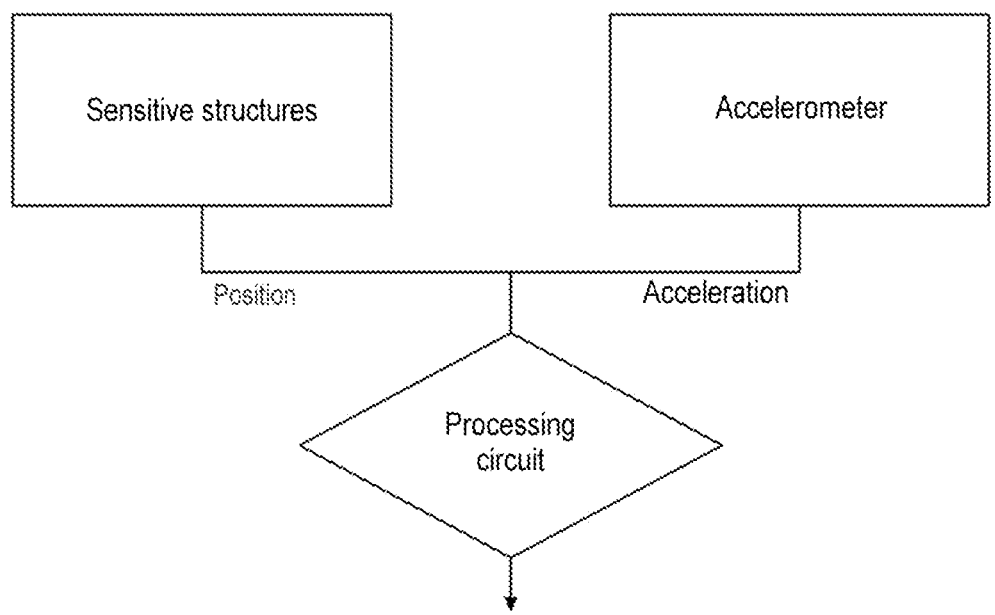
FIG. 9 is a block diagram illustrating how the piece of information delivered by an accelerometer is taken into account in the measurement.

As mentioned previously, an accelerometer 4 can be linked to the processing circuit 3. As illustrated in FIG. 9, the processing circuit 3 can then be arranged to take account of the disturbance induced by the acceleration on the measurement performed by means of the sensitive structures 20.

For example, as long as the modulus of the acceleration is greater than a predefined threshold, the contact pressure measurement is not taken into account.

In a variant, the accelerometer 4 is used to give an indication on the angular position of the steering wheel which, correlated with the position of the hands can make it possible to assess the quality of the driving.

The accelerometer used is, for example, that of an airbag.

Obviously, the invention is not limited to the examples which have just been described.

For example, the invention can be applied to a maneuvering member other than a steering wheel, for example a joystick or a ball or fork placed on the steering wheel for driving with one hand, or be applied to the determination of the posture of a person on a seat.

The detection of the position of the hands can be used to detect abnormal behavior of the driver and/or it can be used to detect a predefined gesture of the hands to perform commands.

For example, the detection of two very rapid repeated presses on a predefined zone of the steering wheel generates a command to start the car radio or to change station. It can even trigger braking if, for example, the pressure of the hands on the steering wheel exceeds a certain threshold. The device can then serve as an alternative to the accelerator circle of the steering wheel for handicapped people.

The invention can also equip an instrumented sole, to determine the intensity of foot pressure on the ground.

The invention is not limited to a particular number of sensitive structures, and the number of intermediate detection zones need not be equal to the number of primary detection zones, for example if it is decided that the determination of the positioning of the contact relative to one or more primary detection zones is of no benefit. For example, the detection surface comprises three primary detection zones, namely one situated at the center at the top of the steering wheel and two situated on the sides, and only two intermediate detection zones, namely between the top central detection zone and each of the side detection zones. A greater number of sensitive structures can be used, with the use of a multiplexer if necessary to use one and the same oscillator with several sensitive structures. For example, several sensitive structures of small dimensions are used, which are positioned such that the hand, widthwise, contacts more than two sensitive structures at the same time.

The oscillating circuits can be produced other than with Colpitts oscillators, for example with Hartley, Clapp or other oscillators.

The electrodes of the sensitive structures can be produced in different ways and, for example, by printing on the rim of the steering wheel or on the coating which covers it.

The determination of the various abovementioned thresholds Sprox, Sc, Spmax and Sj can advantageously be performed by averaging over a set of read values.

The measurements of position of the hands on the steering wheel that are performed can be combined with other measurements representative of a physiological state of the user, for example electrodermal activity, PPG, ECG measurements) in order to determine a level of stress, of concentration or of doziness.

All or some of the thresholds resulting from the calibration can be stored for different drivers, in order to avoid having to perform the calibration once again on each change of driver.

The invention claimed is:

1. A multipoint contact detection device, comprising:
at least two capacitive or inductive sensitive structures, associated with respective primary detection zones of a surface that a person is likely to contact, at least two of these sensitive structures being positioned with a separation that is small enough between them to define at least one intermediate detection zone that the person is likely to contact while exerting a capacitive or inductive disturbance on the sensitive structures, and
a processing circuit configured to
detect, for each sensitive structure, a disturbance induced by the person coming into proximity or into contact, the processing circuit being configured to generate a signal representative of an amplitude of the disturbance induced by the contact or proximity of the person with each primary detection zone,
locate, from the detected disturbances, a region or regions of the surface with which the person comes into contact, relative to the primary detection zones and the at least one intermediate detection zone, the contact being considered to be made in an intermediate detection zone when the disturbances induced on all or part of the primary detection zones satisfy predefined relationships, and
measure a contact pressure of the person with said surface, the processing circuit being configured to generate a signal representative of the amplitude of the disturbance induced by the contact pressure of the person with the surface.

2. The device according to claim 1, the processing circuit being configured to detect the disturbance induced on an oscillation frequency of an oscillator with a resonant circuit of LC type, of which at least a part of the capacitance or of the inductance is formed by the sensitive structure.

3. The device according to claim 2, the processing circuit being configured to generate a signal representative of the amplitude of a frequency variation induced by the contact pressure or the proximity of the person with each primary detection zone.

4. The device according to claim 1, the processing circuit being configured to compare the signal representative of the amplitude of the disturbance induced on at least one sensitive structure with at least one predefined threshold and to generate from the comparison at least one piece of information relating to one of the contact pressure and to an extent of contact of the person on an associated primary detection zone.

5. The device according to claim 1, the processing circuit being configured to compare the signal representative of the amplitude of the disturbance induced on at least one sensitive structure with at least one predefined threshold and to generate from the comparison at least one piece of information relating to a location of the contact of the person on the surface.

6. The device according to claim 1, the sensitive structures being capacitive.

7. The device according to claim 6, each sensitive structure comprising two electrodes, including at least one electrode specific to each sensitive structure.

8. The device according to claim 1, comprising at least one accelerometer, the processing circuit being configured to take account of the disturbance induced by acceleration on a measurement performed using the sensitive structures.

9. The device according to claim 8, the processing circuit being configured to disregard a result of the measurement performed using the sensitive structures when a detected acceleration is greater than a predefined threshold.

10. The device according to claim 1, comprising at least three sensitive structures defining at least five zones of detection along the surface.

11. The device according to claim 1, the sensitive structures being distributed on a maneuvering member and the processing circuit being configured to deliver a piece of information representative of at least one of a position of hands on the maneuvering member and a pressure of the hands on the maneuvering member.

12. A maneuvering member equipped with a detection device according to claim 1.

13. The maneuvering member according to claim 12, comprising at least two electrodes associated with one and the same primary detection zone on the maneuvering member.

14. A method for locating on a surface at least one point of contact of a person with the surface, using a multipoint contact detection device comprising at least two capacitive or inductive sensitive structures associated with respective primary detection zones, at least two of the sensitive structures being positioned with a separation that is small enough between them to define at least one intermediate detection zone that the person is likely to contact while exerting a capacitive or inductive disturbance on the sensitive structures, comprising:
   for each sensitive structure, detecting a disturbance induced by the person coming into contact or into proximity, and
   from the detected disturbances, locating a region or regions of the surface with which the person comes into contact, relative to the primary detection zones and the at least one intermediate detection zone, the contact being considered to be made in an intermediate detection zone when disturbances induced on all or part of the primary detection zones satisfy, predefined relationships where the disturbances induced on each of the two primary detection zones adjacent to the intermediate detection zone exceed a predefined threshold.

15. The method according to claim 14, comprising, during a calibration step for each user and for each primary detection zone, determining a threshold Sc of an amplitude of disturbance induced on a corresponding sensitive structure, representative of the contact without pressure of the person with the primary detection zone.

16. The method according to claim 15, comprising, during the calibration step for each user and for each primary detection zone, determining a threshold Spmax of an amplitude of disturbance induced on the sensitive structure, representative of a maximum pressure exerted by the person on the detection zone.

17. The method according to claim 14, comprising, during a calibration step for each user and for each primary detection zone, determining a threshold Sprox of an amplitude of disturbance induced on the sensitive structure, corresponding to the person coming into proximity with the primary detection zone without contact thereof with the primary detection zone.

18. The method according to claim 14, wherein Sprox designates a threshold of amplitude of disturbance induced on the sensitive structure corresponding to a hand of the person coining into proximity with the primary detection zone, without contact thereof with the primary detection zone, Sc designates a threshold of amplitude of disturbance induced on a corresponding sensitive structure, representative of the contact without pressure of the hand of the person with the primary detection zone, Spmax designates a threshold of amplitude of disturbance induced on the sensitive structure, representative of a maximum pressure exerted by the hand of the person on the detection zone, the method comprising:
   determining the position of the hands of the person with the surface by repeating the following steps, with j being an integer lying between 1 and a number N of primary detection zones, and Sj designating the amplitude of disturbance induced on the sensitive structure corresponding to the primary detection zone j:
      if Sprox<Sj<Sc and Sprox<Sj+1<Sc determining that the hand is located on the intermediate detection zone between primary detection zones j and j+1,
      if Sc<Sj<Spmax determining that the hand is located on the primary detection zone j,
      if Sj>Spmax and Sk<Sprox, for k< >j, k lying between 1 and N, determining that both hands are positioned in the primary detection zone j,
      if Sj>Spmax and Sj+1>Sprox or Sj−1>Sprox, determining that one hand is on the primary detection zone j and the other hand is on the primary detection zone j+1 or on an adjacent primary detection zone j−1.

19. The method according to claim 14, wherein hands of the person come into contact with two respective primary detection zones u and v, the method comprises determining whether amplitudes Su or Sv of disturbance induced on the sensitive structure which are measured satisfy relationships Su>Sc and Sv>Sc, in which Sc designates a threshold of disturbance induced on the sensitive structure by the contact without pressure of the hand of the person on a corresponding primary detection zone.

20. The method according to claim 19, comprising:
   during a calibration step for each user and for each primary detection zone, determining a threshold Spmax of an amplitude of disturbance induced on the sensitive structure, representative of a maximum pressure exerted by the person on the detection zone, and
   assessing contact pressure of each hand of the person with the surface by quantifying the amplitudes Su and Sv according to pressure levels previously established over an interval Sc-Spmax.

21. The method according to claim 14, comprising measuring an acceleration to which the surface is subjected and, if a modulus of the acceleration exceeds a predefined threshold, the measurement of the disturbance induced on the sensitive structures is disregarded.

22. The method according to claim 14, comprising:
   determining a position of the hands of a driver on a steering wheel, and
   generating an alarm when the determined position of the hands does not correspond to an expected driving position.

* * * * *